United States Patent
van Rijs et al.

(10) Patent No.: US 8,416,023 B2
(45) Date of Patent: Apr. 9, 2013

(54) SYSTEM AND METHOD FOR COMPENSATING FOR CHANGES IN AN OUTPUT IMPEDANCE OF A POWER AMPLIFIER

(75) Inventors: Freerk van Rijs, Nijmegen (NL); Alexander Otto Harm, Nijmegen (NL)

(73) Assignee: NXP B.V. (NL)

( * ) Notice: Subject to any disclaimer, the term of this patent is extended or adjusted under 35 U.S.C. 154(b) by 92 days.

(21) Appl. No.: 12/796,559

(22) Filed: Jun. 8, 2010

(65) Prior Publication Data

US 2011/0298535 A1    Dec. 8, 2011

(51) Int. Cl.
    *H03F 3/191*    (2006.01)
(52) U.S. Cl. .......................... 330/302; 330/277
(58) Field of Classification Search ............. 330/277, 330/302, 307
    See application file for complete search history.

(56) References Cited

U.S. PATENT DOCUMENTS

| | | | |
|---|---|---|---|
| 5,017,888 A * | 5/1991 | Meinzer | 330/295 |
| 5,880,635 A | 3/1999 | Satoh | |
| 6,160,449 A * | 12/2000 | Klomsdorf et al. | 330/149 |
| 6,859,104 B2 * | 2/2005 | Toncich et al. | 330/302 |
| 7,102,429 B2 * | 9/2006 | Stengel et al. | 330/302 |
| 7,151,411 B2 * | 12/2006 | Martin et al. | 330/305 |
| 7,411,449 B2 * | 8/2008 | Klingberg et al. | 330/124 R |
| 7,509,100 B2 * | 3/2009 | Toncich | 330/302 |
| 7,764,140 B2 * | 7/2010 | Nagarkatti et al. | 330/302 |
| 7,961,048 B2 * | 6/2011 | Oakley et al. | 330/295 |
| 8,198,938 B2 * | 6/2012 | Yu | 330/124 R |
| 2004/0251984 A1 | 12/2004 | Javor | |
| 2006/0145758 A1 | 7/2006 | Klomsdorf et al. | |
| 2007/0080750 A1 * | 4/2007 | Liebenrood | 330/252 |
| 2007/0085609 A1 * | 4/2007 | Itkin et al. | 330/302 |
| 2010/0026393 A1 * | 2/2010 | Keerti et al. | 330/302 |
| 2011/0279178 A1 * | 11/2011 | Outaleb et al. | 330/124 R |

FOREIGN PATENT DOCUMENTS

| | | |
|---|---|---|
| EP | 1093222 A1 | 4/2001 |
| GB | 2356095 A | 5/2001 |
| GB | 2443930 A | 5/2008 |
| WO | 2008007330 A2 | 1/2008 |
| WO | 2009034659 A1 | 3/2009 |

OTHER PUBLICATIONS

W.C. Edmund Neo et al.; "Adaptive Multi-Band Multi-Mode Power Amplifier using Integrated Varactor-Based Tunable Matching Networks"; IEEE Journal of Solid-State Circuits, IEEE Service Center, Piscataway, NJ, USA; vol. 41, No. 9; Sep. 2006, pp. 2166-2176.
Sifen Luo et al.; "A Monolithic Si PCS-CDMA Power Amplifier with an Impedance-Controllable Biasing Scheme", 2001 IEEE Radio Frequency Integrated Circuits (RFIC) Symposium; Digest of Papers, Phoneix, AZ; May 20-22, 2001, pp. 217-220.

* cited by examiner

*Primary Examiner* — Khanh V Nguyen

(57) ABSTRACT

System and method for compensating for changes in an output impedance of a power amplifier uses an impedance compensating circuit with an impedance inverter coupled to the power amplifier. The impedance inverter of the impedance compensating circuit is configured such that an output impedance of the impedance inverter is proportional to the inverse of the output impedance of the power amplifier to compensate for changes in the output impedance of the power amplifier.

20 Claims, 9 Drawing Sheets

SYSTEM AND METHOD FOR COMPENSATING FOR CHANGES IN AN OUTPUT IMPEDANCE OF A POWER AMPLIFIER

Embodiments of the invention relate generally to electrical systems and methods and, more particularly, to power amplifier impedance compensation circuits and power amplifier impedance compensation methods.

An impedance compensation circuit for a power amplifier, also commonly known as an impedance matching circuit, compensates for the output impedance of the power amplifier so that the power amplifier can achieve a high power efficiency. However, a power amplifier generally operates in a supply voltage range, and thus, the output impedance of the power amplifier may vary under different supply voltages. In general, conventional impedance compensation circuits cannot properly compensate for the output impedance of the power amplifier under all of the voltages in the supply voltage range. Consequently, the power amplifier may only achieve a high power efficiency under certain voltages in the supply voltage range. Therefore, there is a need to provide an impedance compensation system and method for a power amplifier that properly compensates the output impedance of the power amplifier so that the power amplifier can achieve a high power efficiency under all of the voltages in a supply voltage range.

System and method for compensating for changes in an output impedance of a power amplifier uses an impedance compensating circuit with an impedance inverter coupled to the power amplifier. The impedance inverter of the impedance compensating circuit is configured such that an output impedance of the impedance inverter is proportional to the inverse of the output impedance of the power amplifier to compensate for changes in the output impedance of the power amplifier. By using the impedance inverter, the output impedance of the power amplifier can be properly compensated so that the power amplifier can achieve a high power efficiency under all of the voltages in a supply voltage range.

In an embodiment, a method for compensating for changes in an output impedance of a power amplifier includes coupling the power amplifier to an impedance inverter of an impedance compensation circuit and compensating for the changes in the output impedance of the power amplifier using an output impedance of the impedance inverter that inversely changes with respect to the output impedance of the power amplifier.

In an embodiment, an impedance compensation circuit includes an input terminal connected to a power amplifier, an impedance inverter coupled to the power amplifier through the input terminal, the impedance inverter being configured such that an output impedance of the impedance inverter is proportional to the inverse of the output impedance of the power amplifier, and an output terminal connected to a load of the power amplifier.

In an embodiment, a power amplifier circuit includes a power amplifier having an output impedance and an impedance compensation circuit connected to the power amplifier. The impedance compensation circuit includes an input terminal connected to the power amplifier, an impedance inverter coupled to the power amplifier through the input terminal, the impedance inverter being configured such that the output impedance of the impedance inverter is proportional to the inverse of an output impedance of the power amplifier, and an output terminal connected to a load of the power amplifier.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
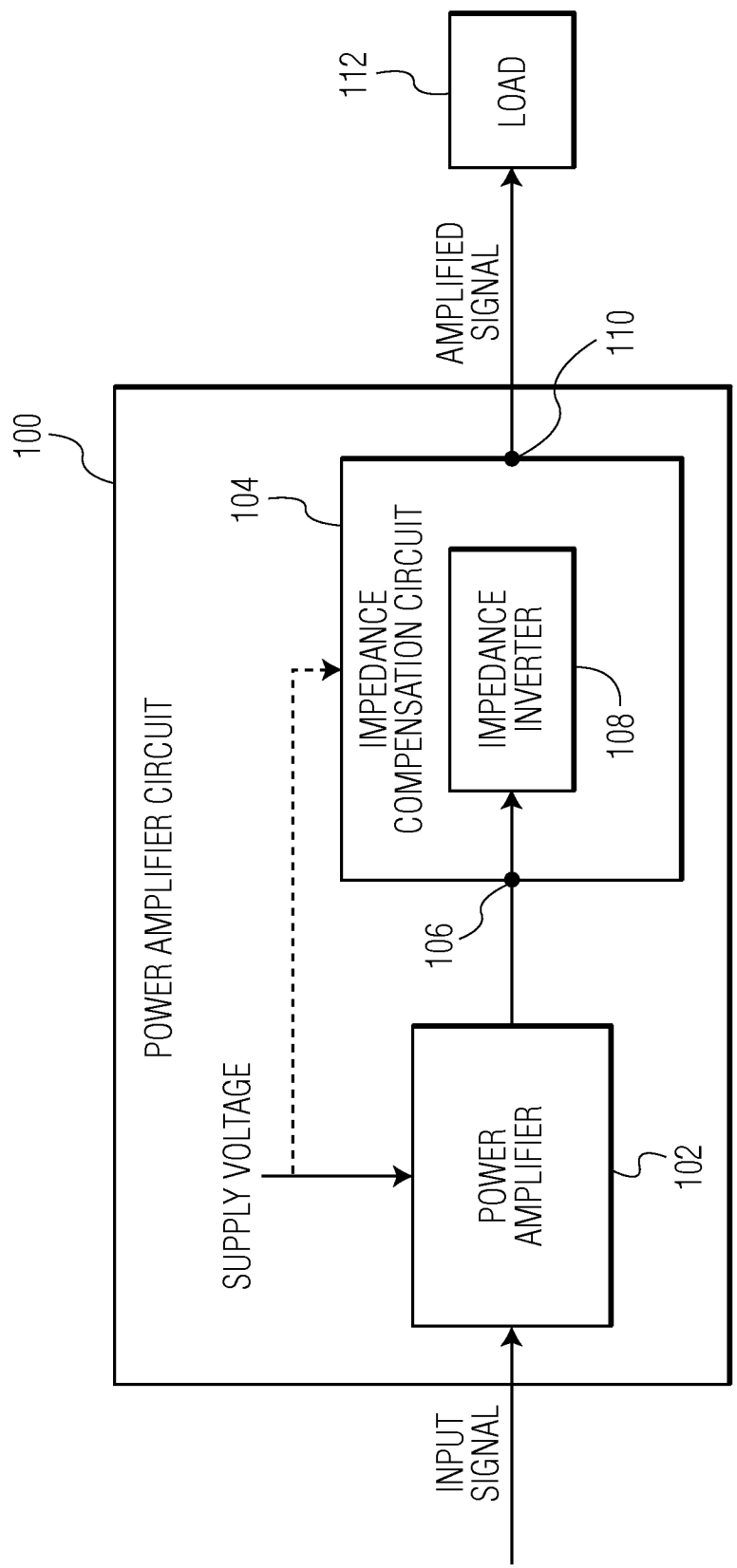
FIG. 1 shows a schematic block diagram of a power amplifier circuit in accordance with an embodiment of the invention.

FIG. 1 shows a schematic block diagram of a power amplifier circuit 100 in accordance with an embodiment of the invention. The power amplifier circuit is configured to amplify an input signal into an amplified signal. In an embodiment, the power amplifier circuit is a component of a wireless device. For example, the power amplifier circuit is a component of a radio frequency (RF) base station. In this case, the power efficiency of the power amplifier is defined as the ratio between the RF output power of the power amplifier and the power consumed by the power amplifier. The radio RF base station is part of a wireless network such as a mobile carrier network that communicates with wireless devices. The wireless network and the wireless devices can support various RF communications protocols, including without limitation, Global System for Mobile communications (GSM), Universal Mobile Telecommunications System (UMTS), Code Division Multiple Access (CDMA), Worldwide Interoperability for Microwave Access (WiMax) and communications protocols as defined by the 3rd Generation Partnership Project (3GPP) or the 3rd Generation Partnership Project 2 (3GPP2), 4G Long Term Evolution (LTE), and IEEE 802.16 standards bodies.

In the embodiment depicted in FIG. 1, the power amplifier circuit 100 includes a power amplifier 102 and an impedance compensation circuit 104 for the power amplifier. Although the power amplifier circuit is depicted and described with certain components and functionality, other embodiments of the power amplifier circuit may include fewer or more components to implement less or more functionality.

The power amplifier 102 of the power amplifier circuit 100 is configured to perform signal amplification on the input signal. The power amplifier has an output impedance, which is also known as an internal impedance of the power amplifier. The output impedance of the power amplifier is electrical impedance. The power amplifier is configured to operate in a supply voltage range. For example, the power amplifier operates between 6 volts (V) and 32 V or between 8 V and 48 V. In an embodiment, the power amplifier is configured such that the output impedance of the power amplifier is dependent on the supply voltage to the power amplifier. The power amplifier may be configured such that signal power of an output signal from the power amplifier is dependent upon the supply voltage to the power amplifier.

The impedance compensation circuit 104 of the power amplifier circuit 100 is configured to compensate for changes in the output impedance of the power amplifier 102. In the embodiment depicted in FIG. 1, the impedance compensation circuit includes an input terminal 106 connected to the power amplifier, an impedance inverter 108 coupled to the power amplifier through the input terminal and an output terminal 110 connected to a load 112 of the power amplifier. The impedance inverter is configured such that an output electrical impedance of the impedance inverter is proportional to the inverse of the output impedance of the power amplifier. In an embodiment, the impedance compensation circuit is configured to electrically resonate with the output impedance of the power amplifier under the operating frequency of the power amplifier. Because of the impedance compensation circuit, the power amplifier can achieve a high power efficiency. As an example, when the power efficiency of the power amplifier is over 65%, the power efficiency of the power amplifier is deemed high. When the power efficiency of the power amplifier is over 60% but below 65%, the power efficiency of the power amplifier is deemed intermediate. When the power efficiency of the power amplifier is below 55%, the power efficiency of the power amplifier is deemed low. The internal impedance of the impedance compensation circuit may not match the output impedance of the power amplifier. In some embodiments, the impedance of the impedance compensation circuit is neither equal to the output impedance of the power amplifier nor equal to the complex conjugate of the output impedance of the power amplifier.

Figure 4:
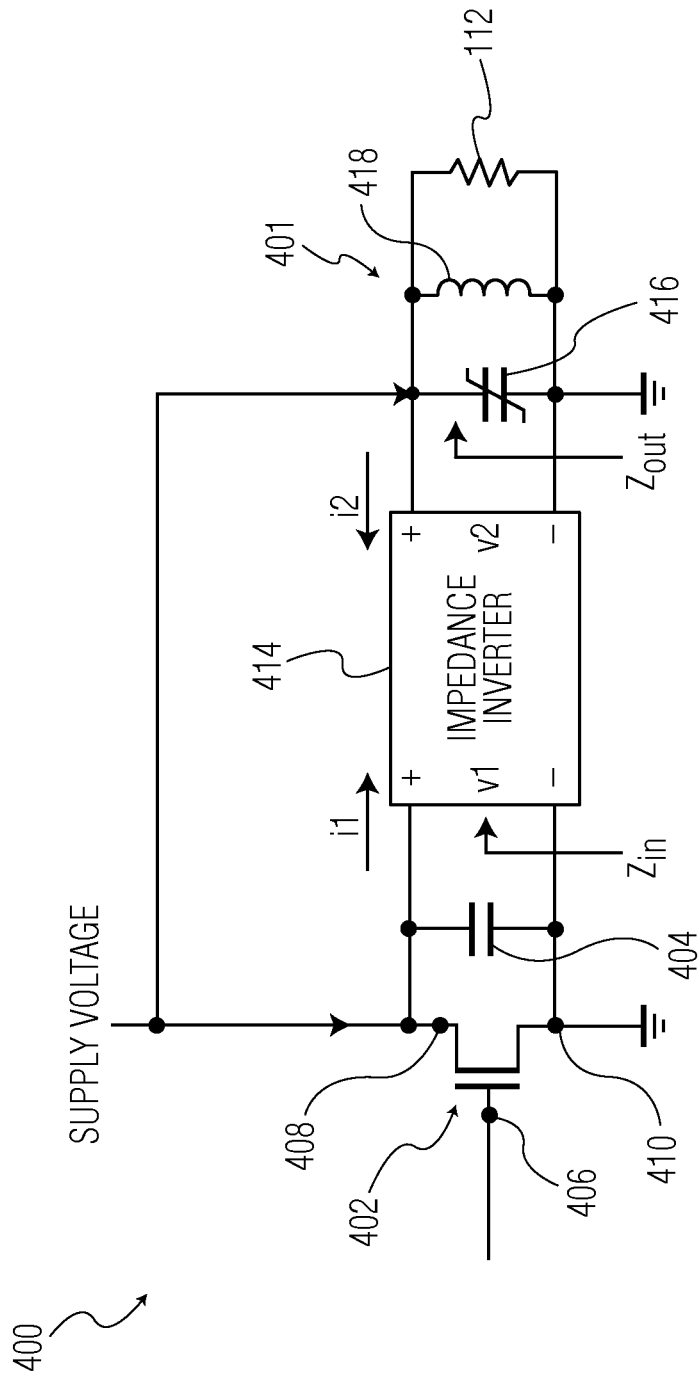
FIGS. 4-6 depict embodiments of power transistors and impedance compensation circuits.
Figure 5:
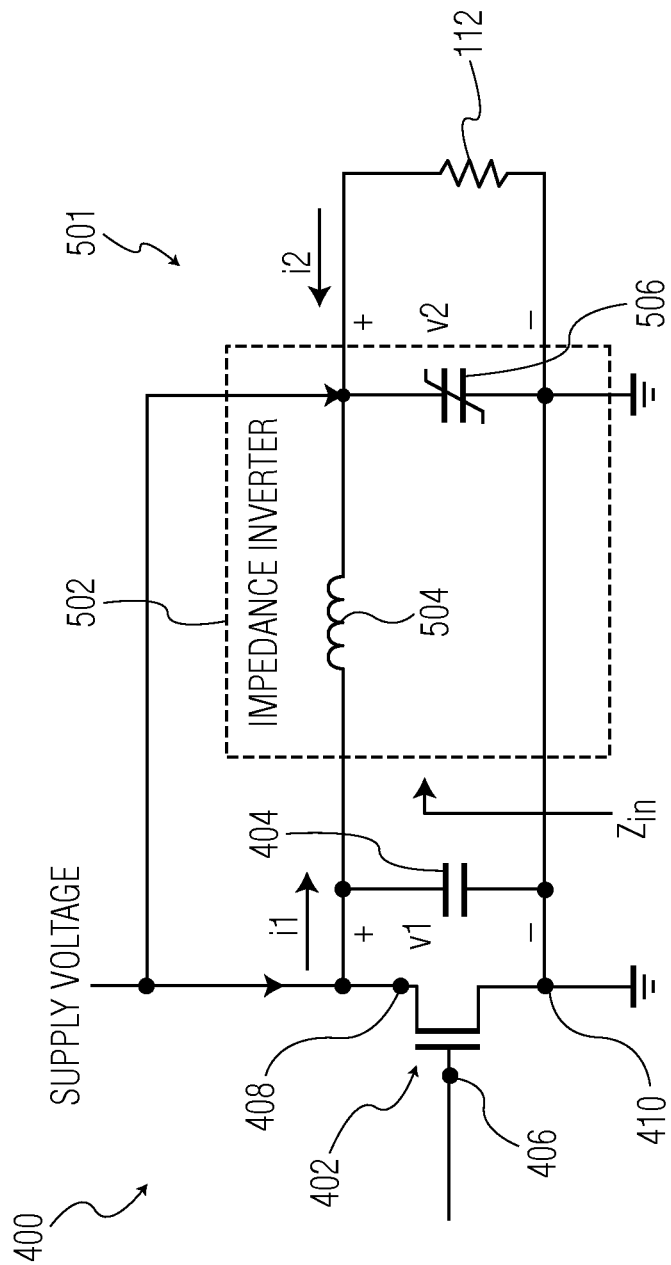
Figure 6:
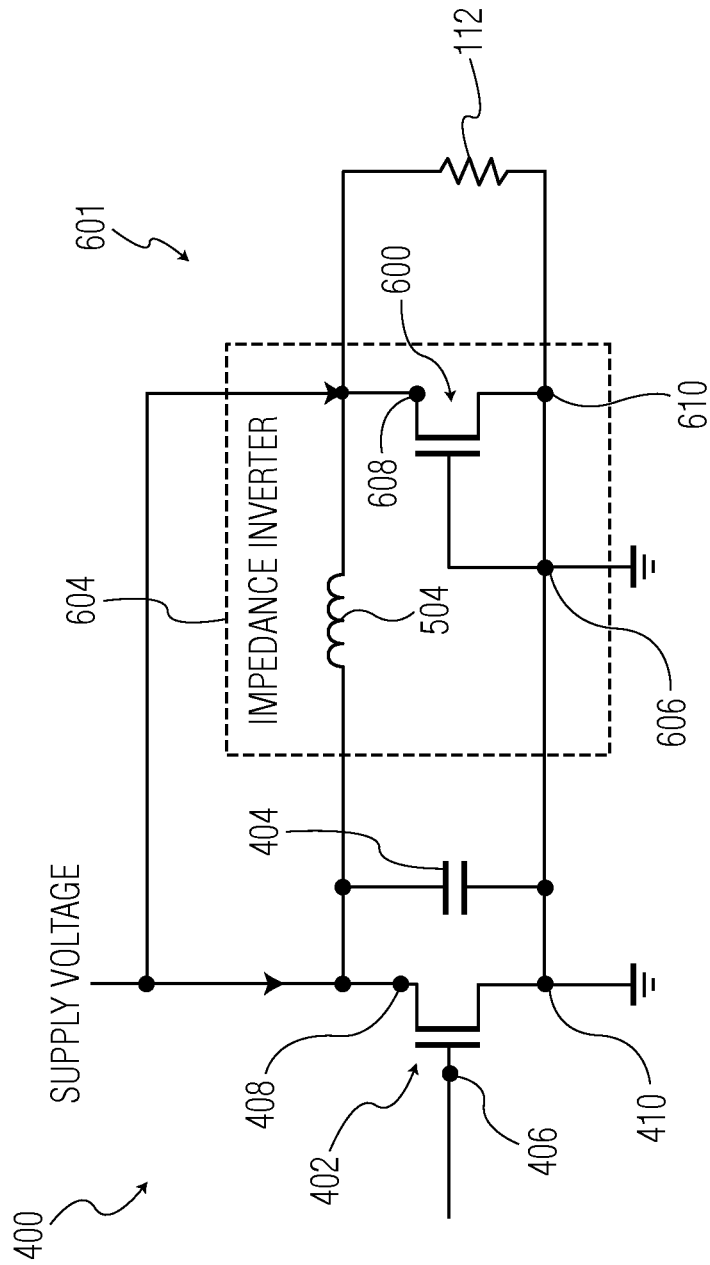

Using a conventional impedance compensation circuit without the impedance inverter 108, the power amplifier 102 can only achieve high power efficiencies under some supply voltages in the supply voltage range of the power amplifier. In other words, using a conventional impedance compensation circuit, the power amplifier cannot achieve high power efficiencies under all of the supply voltages in the supply voltage range. For example, the power efficiency of the power amplifier may be optimal at high voltages in the supply voltage range but decrease rapidly for lower supply voltages in the supply voltage range. One root cause that the output impedance of the power amplifier cannot be properly compensated by a conventional impedance compensation circuit under all of the supply voltages in the supply voltage range is that the output impedance of the power amplifier is dependent on the current supply voltage to the power amplifier. When the supply voltage to the power amplifier changes, the output impedance of the power amplifier changes. As a result, different compensation impedances are needed to compensate for changes in the output impedance of the power amplifier. A conventional impedance compensation circuit cannot generate different compensation impedances under different supply voltages of the power amplifier. However, the impedance compensation circuit 104 depicted in FIG. 1 can generate different compensation impedances under different supply voltages due to the impedance inverter. As a result, the power amplifier can maintain a high power efficiency under all of the supply voltages in the supply voltage range. Some examples of the impedance compensation circuit depicted in FIG. 1 are illustrated in FIGS. 4-6. Detailed description of impedance compensation in accordance with embodiments of the invention is provided below with respect to the impedance compensation circuits 412, 500, 602 depicted in FIGS. 4-6.

In an embodiment, the power amplifier 102 and the impedance compensation circuit 104 are configured to operate in the same supply voltage range. For example, the power amplifier and the impedance compensation circuit are configured to operate in a supply voltage range that is between 8V and 48 V. The supply voltage to the power amplifier is also referred to as the operating voltage of the power amplifier. In this case, the power amplifier and the impedance compensation circuit may be further configured to operate under the same supply voltage. For example, the power amplifier and the impedance compensation circuit are configured to operate under the same supply voltage of 28 V.

In an embodiment, the output impedance of the power amplifier 102 is the output impedance of a component of the power amplifier. The power amplifier may have multiple output ports with different output impedances.

The power amplifier 102 depicted in FIG. 1 may be a main power amplifier of a Doherty power amplifier circuit. The Doherty power amplifier circuit also includes a peak power amplifier that is connected in parallel with the main power amplifier and multiple 90 degree phase shifters. Using the phase shifters, load impedance of the main power amplifier is changed by the peak power amplifier so that the power efficiency of the main power amplifier can be improved.

In an embodiment, the power amplifier circuit 100 depicted in FIG. 1 is implemented in transistor technologies, such as Lateral Diffused Metal Oxide Semiconductor Transistor (LDMOST) technology, Gallium Nitride pseudo-morphic High Electron Mobility Transistor (GaN pHEMT) technology and Gallium arsenide (GaAs) transistor technology. An embodiment of the power amplifier circuit of FIG. 1 that is implemented in a transistor technology is depicted in FIG. 2.

Figure 2:
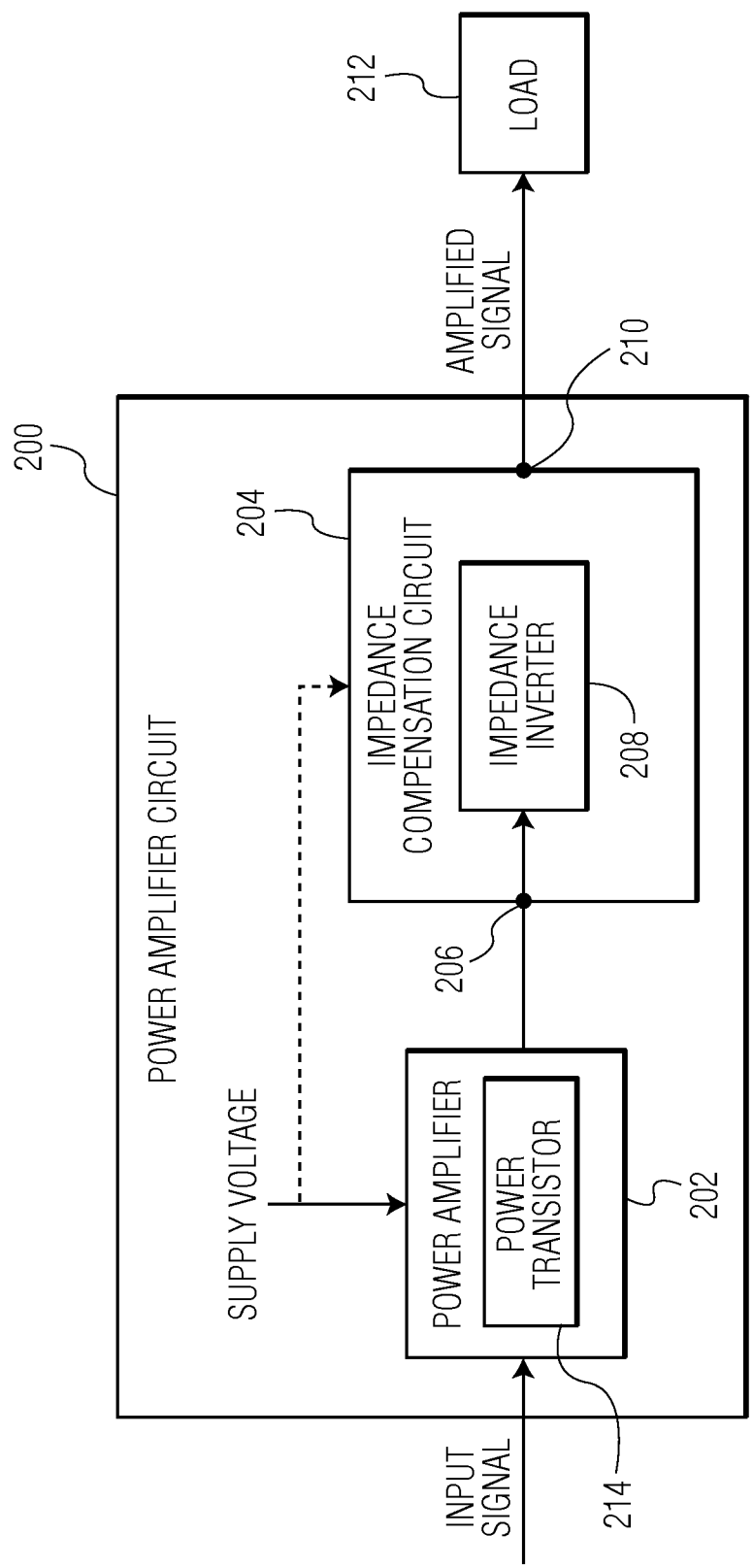
FIG. 2 depicts an embodiment of the power amplifier circuit depicted in FIG. 1 that is implemented in a transistor technology.

In the embodiment depicted in FIG. 2, the power amplifier circuit 200 includes a power amplifier 202 that includes at least one power transistor 214 and an impedance compensation circuit 204 for the power amplifier. The power transistor of the power amplifier may be any type of power transistor, such as an LDMOS transistor, a GaN pHEMT or a GaAs transistor. The power transistor has an output impedance, which is also known as an internal impedance of the power transistor. In the embodiment depicted in FIG. 2, the output impedance of the power amplifier is the output impedance of the power transistor. Although the power amplifier is shown in FIG. 2 as including only one power transistor, the power amplifier may include more than one power transistor in other embodiments.

The impedance compensation circuit 204 of the power amplifier circuit 200 is configured to compensate for changes in the output impedance of the power transistor 214. The impedance compensation circuit includes an input terminal 206 connected to the power transistor 214, an impedance inverter 208 that is coupled to the power transistor through the input terminal and an output terminal 210 connected to a load 212 of the power amplifier. The impedance inverter is configured such that output impedance of the impedance inverter is proportional to the inverse of the output impedance of the power transistor. In an embodiment, the impedance compensation circuit is configured to electrically resonate with the output impedance of the power transistor.

Figure 3:
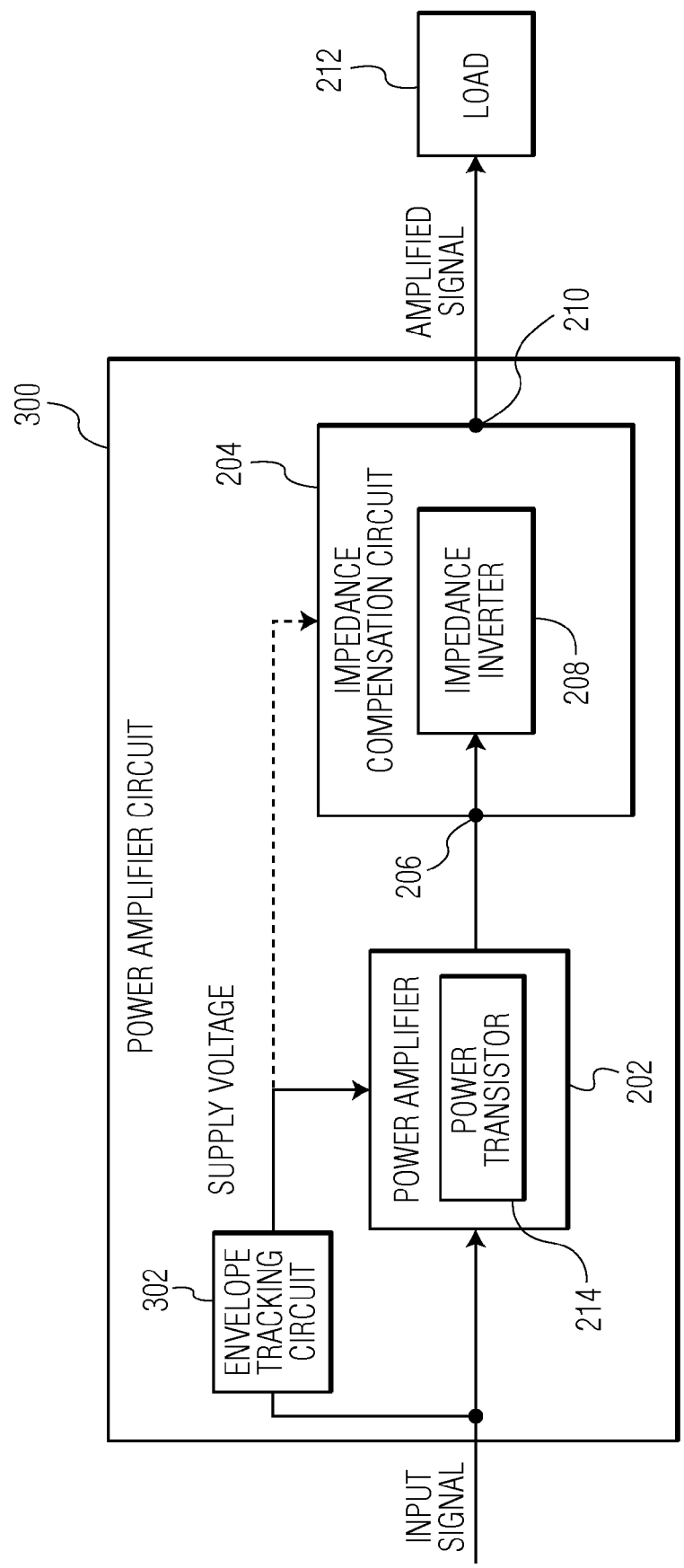
FIG. 3 depicts an embodiment of the power amplifier circuit depicted in FIG. 2 that uses envelope tracking.

The power amplifier circuits 100, 200 depicted in FIGS. 1 and 2 may use envelope tracking, where a supply voltage to the power amplifier tracks the envelope of the input signal. An embodiment of the power amplifier circuit 200 of FIG. 2 that use an envelope tracking technology is shown in FIG. 3. In the embodiment depicted in FIG. 3, the power amplifier circuit 300 includes the power amplifier 202, an envelope tracking circuit 302, and the impedance compensation circuit 204 for the power amplifier. Thus, compared to the power amplifier circuit depicted in FIG. 2, the power amplifier circuit depicted in FIG. 3 includes one additional component, i.e., the envelope tracking circuit 302, which is configured to generate a supply voltage to the power amplifier that tracks an envelope of an input signal of the power amplifier. By making the supply voltage to the power amplifier to track an envelope of an input signal of the power amplifier, the power amplifier can achieve higher power efficiency.

Some examples of the power transistors 204 depicted in FIGS. 2 and 3 and the impedance compensation circuits 104, 206 depicted in FIGS. 1-3 are illustrated in FIGS. 4-6. In the examples depicted in FIGS. 4-6, a power transistor 400 is connected to one of impedance compensation circuits 401, 501, 601. The power transistor 400 has a parasitic capacitance. In other words, the power transistor 400 can be seen as a combination of an ideal power transistor 402 and a parasitic capacitor 404 that is external to the ideal power transistor. The power transistor 400 has a gate terminal 406, a drain terminal 408 and a source terminal 410. The source terminal of the power transistor is directly connected to electrical ground. The power transistor may be a field effect transistor (FET), such as an LDMOS FET, a GaN pHEMT FET or a GaAs FET. Although the power transistor 400 in the embodiments depicted in FIGS. 4-6 has a parasitic capacitance, the power transistor may have a parasitic inductance or a combination of parasitic capacitance and inductance in other embodiments. In an embodiment, the parasitic inductance is provided by on-chip metal interconnect and/or bondwires.

The impedance compensation circuit 412 depicted in FIG. 4 includes an impedance inverter 414, a variable capacitor 416 that is directly connected to ground, and an inductor 418. The impedance inverter is coupled to the drain terminal 408 and the source terminal 410 of the power transistor 400. The input impedance $Z_{in}$ to the impedance inverter is the output impedance of the power transistor. In the embodiment depicted in FIG. 4, the input impedance $Z_{in}$ to the impedance inverter is the parasitic capacitance of the power transistor. In an embodiment, the parasitic capacitance $Z_{in}$ of the power transistor is dependent on the supply voltage to the power transistor. The impedance inverter has an output impedance "$Z_{out}$." The impedance inverter is coupled to the variable capacitor and the output impedance $Z_{out}$ of the impedance inverter is the input impedance to the variable capacitor. The power transistor and the impedance compensation circuit are configured to operate under the same supply voltage. The inductor of the impedance compensation circuit, which is also referred to as a shunt inductor, is configured to match the capacitive output impedance of the power transistor. The inductor can be merged into the load 112 such that the load provides complex impedance. The impedance compensation circuit is coupled to the load 112 of the power amplifier.

The impedance inverter 414 of the impedance compensation circuit 401 is configured such that the output impedance $Z_{out}$ of the impedance inverter is proportional to the inverse of the parasitic capacitance $Z_{in}$ of the power transistor 400. In an embodiment, the impedance inverter is an electronic circuit with a Y-parameter matrix, which can be expressed as:

$$Y = \begin{pmatrix} 0 & \frac{j}{Z_c} \\ \frac{j}{Z_c} & 0 \end{pmatrix}, \text{ where } \begin{pmatrix} i1 \\ i2 \end{pmatrix} = Y \begin{pmatrix} v1 \\ v2 \end{pmatrix}, \quad (1)$$

where $Z_c$ represents a characteristic impedance of the impedance inverter. The Y-parameter matrix of the impedance inverter is also known as the admittance matrix of the impedance inverter. Under the condition shown in equation (1), the input impedance $Z_{in}$ to the impedance inverter and the output impedance $Z_{out}$ of the impedance inverter satisfy:

$$Z_{out} = \frac{Z_c^2}{Z_{in}}. \quad (2)$$

In other words, the product of the output impedance $Z_{out}$ of the impedance inverter and the parasitic capacitance $Z_{in}$ of the power transistor is equal to the square function of the characteristic impedance $Z_c$ of the impedance inverter. The impedance value relationship specified in equation (2) is valid whether or not there is a resonance condition between the power transistor and the impedance compensation circuit.

The supply voltage to the impedance compensation circuit 401 is same as the supply voltage to the power transistor 400. In an embodiment, the parasitic capacitance $Z_{in}$ of the power transistor decreases when the supply voltage increases. When an impedance compensation circuit has only the shunt inductor 418, the inductance of the shunt inductor generally does not change when the supply voltage increases. As a result, the impedance compensation circuit with only the shunt inductor cannot compensate the loss in the parasitic capacitance $Z_{in}$ of the power transistor. When an impedance compensation circuit has only the shunt inductor and the variable capacitor 416, the inductance of the shunt inductor generally does not change and the variable capacitor usually cannot increase its capacitance when the supply voltage increases. For example, such a variable capacitor that increases its capacitance when the supply voltage increases does not exist as a semiconductor component. As a result, the impedance compensation circuit with only the shunt inductor and the variable capacitor also cannot properly compensate the loss of the parasitic capacitance $Z_{in}$ of the power transistor. A Micro Electro-Mechanical Switch (MEMS) capacitor may be used. However, an additional bias circuit has to be provided so that the MEMS capacitor can have the required capacitance versus supply voltage profile. In the embodiment depicted in FIG. 4, the impedance compensation circuit and the power transistor can use the same bias circuit. As a result, compared to the MEMS capacitor, the component cost of the power amplifier circuit is reduced. In the embodiment depicted in FIG. 4, the output impedance of the impedance inverter 414 is same as the capacitance of the variable capacitor, and the parasitic capacitance $Z_{in}$ of the power transistor is same as the input capacitance of the impedance inverter. Because of the inverse input/output impedance relationship, the capacitance of the variable capacitor decreases, but is seen at the input of the impedance inverter as an increasing capacitance, when the parasitic capacitance $Z_{in}$ of the power transistor decreases. Therefore, the parasitic capacitance $Z_{in}$ of the power transistor is properly compensated and the power amplifier 202 achieves a high power efficiency under all of the supply voltages.

The impedance compensation circuit 501 depicted in FIG. 5 includes an impedance inverter 502 that includes an inductor 504 and a variable capacitor 506. The impedance compensation circuit is configured to resonate with the parasitic capacitance $Z_{in}$ of the power transistor 400. The variable capacitor 506 is grounded. The power transistor 400 and the impedance compensation circuit 501 are configured to operate under the same supply voltage. The parasitic capacitor 404 of the power transistor, the inductor 504 and the variable capacitor 506 form a pi-network, which is also known as a low-pass compensation network. The inductor of the impedance inverter is coupled to the drain terminal 408 of the power transistor. The variable capacitor of the impedance inverter is coupled to the inductor and the source terminal of the power transistor. The impedance inverter has a Y-parameter matrix that can be expressed as:

$$Y = \begin{pmatrix} j\omega C + \frac{1}{j\omega L} & \frac{j}{\omega L} \\ \frac{j}{\omega L} & j\omega C + \frac{1}{j\omega L} \end{pmatrix}, \text{ where } \begin{pmatrix} i1 \\ i2 \end{pmatrix} = Y \begin{pmatrix} v1 \\ v2 \end{pmatrix}, \quad (3)$$

where C represents the capacitance value of the variable capacitor and L represents the inductance value of the inductor. The resonance between the variable capacitor and the inductor is achieved at the resonant frequency $\omega_r$, which is equal to $$\frac{1}{\sqrt{CL}}.$$

At the resonant frequency $\omega_r$, the Y-parameter matrix can be expressed as:

$$Y = \begin{pmatrix} 0 & \frac{j}{\omega L} \\ \frac{j}{\omega L} & 0 \end{pmatrix}. \quad (4)$$

In an embodiment, the variable capacitor 506 of the impedance inverter 502 is configured to have the same capacitance value as the parasitic capacitor 404 of the power transistor 400 so that the inductor 504 electrically resonates with both the parasitic capacitor of the power transistor and the variable capacitor. Because of the resonance conditions between the inductor and the parasitic capacitor of the power transistor and the variable capacitor, the power transistor can achieve a high power efficiency.

The variable capacitor 506 depicted in FIG. 5 can be implemented by a transistor with its gate terminal shorted as depicted in FIG. 6. In the embodiment depicted in FIG. 6, the variable capacitor depicted in FIG. 5 is replaced by a transistor 600. As shown in FIG. 6, the impedance compensation circuit 601 includes an impedance inverter 604, which includes an inductor 504 and the transistor 600. The transistor may be an LDMOS transistor, a GaN pHEMT transistor or a GaAs pHEMT/FET/HBT transistor. The transistor includes a gate terminal 606, a drain terminal 608 and a source terminal 610. The gate terminal and the source terminal of the transistor are grounded.

Figure 7:
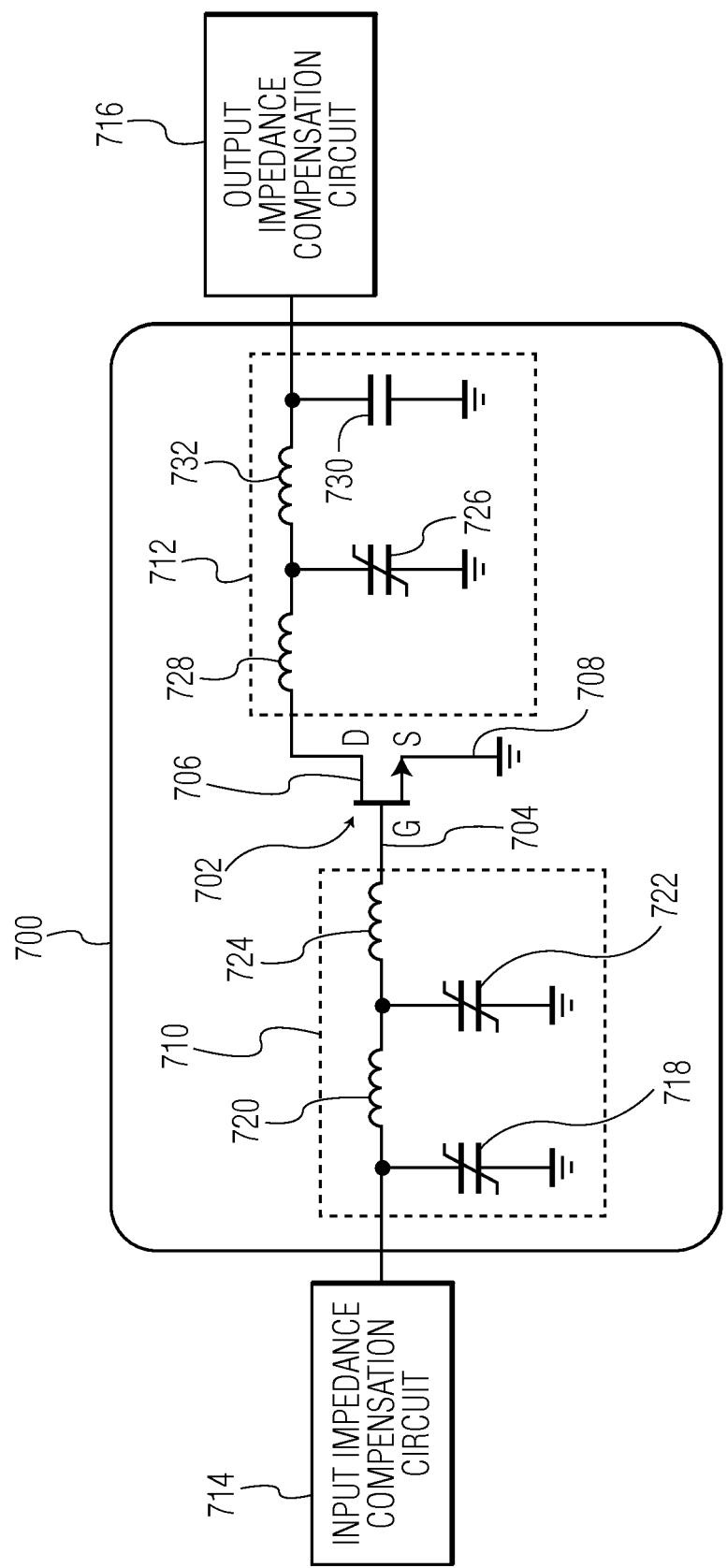
FIG. 7 depicts an example of an Integrated Circuit (IC) package that includes a power transistor and prematch impedance inverters in accordance with an embodiment of the invention.

The power transistors 204, 400 and the impedance compensation circuits 206, 401, 501, 601 depicted in FIGS. 2-6 can be packaged in a single IC package or different IC packages. For example, the power transistors and the impedance inverters depicted in FIGS. 4-6 may be packaged in the same IC package. FIG. 7 depicts an example of an IC package 700 of a power transistor 702. As shown in FIG. 7, the power transistor includes a gate terminal 704, a drain terminal 706 and a source terminal 708 that is grounded. The power transistor is provided with a first prematch impedance inverter 710 and a second prematch impedance inverter 712. The power transistor, the first prematch impedance inverter and the second prematch impedance inverter are packaged in the same IC package. The power transistor depicted in FIG. 7 is similar to or the same as the power transistors 204, 400 depicted in FIGS. 2-6.

In the embodiment depicted in FIG. 7, the first prematch impedance inverter 710 is coupled between the power transistor 702 and an input impedance compensation circuit 714. The first prematch impedance inverter and the input impedance compensation circuit compensate for changes in the input impedance of the power transistor. The second prematch impedance inverter 712 is coupled between the power transistor and an output impedance compensation circuit 716. The second prematch impedance inverter and the output impedance compensation circuit compensate for changes in the output impedance of the power transistor. The first prematch impedance inverter includes a first variable capacitor 718, a first inductor 720, a second variable capacitor 722 and a second inductor 724. The first variable capacitor and the second variable capacitor are optional because the input impedance of the power transistor is not dependent on the supply voltage at the drain terminal 706 of the power transistor. The second inductor is coupled to the gate terminal 704 of the power transistor. The second prematch impedance inverter includes a third variable capacitor 726, a third inductor 728, a fixed capacitor 730 and a fourth inductor 732. The third inductor is coupled to the drain terminal 706 of the power transistor. In the embodiment depicted in FIG. 7, the first, second and third variable capacitors and the fixed capacitor are grounded.

Figure 8B:
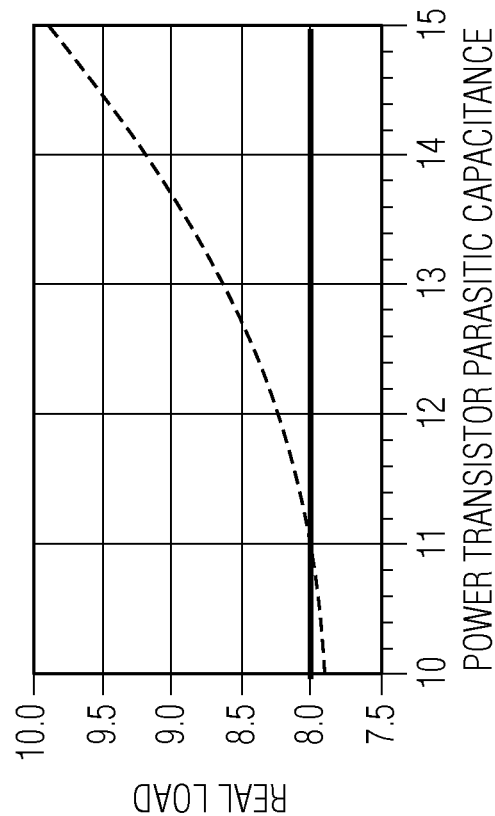
FIGS. 8A and 8B are graphs showing imaginary loads and real loads of an example of a conventional power amplifier circuit and a power amplifier circuit in accordance with an embodiment of the invention.
Figure 8A:
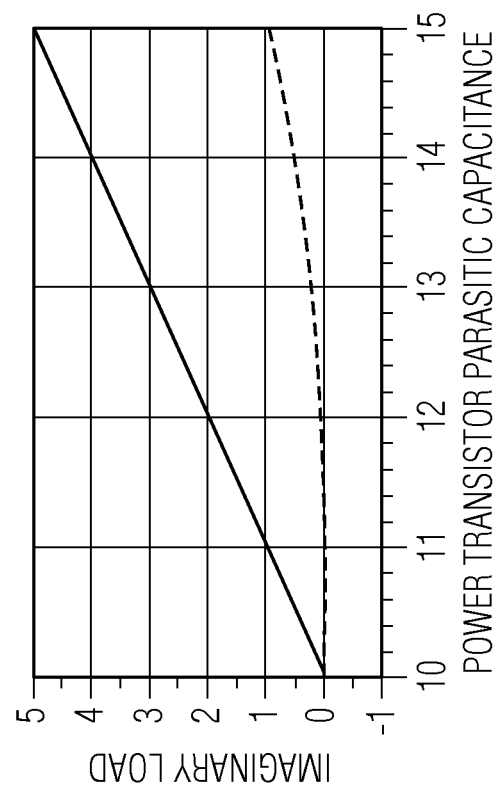

FIGS. 8A and 8B are graphs showing imaginary loads and real loads of a conventional power amplifier circuit and a power amplifier circuit in accordance with an embodiment of the invention. Both the conventional power amplifier circuit and the power amplifier circuit in accordance with an embodiment of the invention have a power transistor and an impedance compensation circuit for the power transistor. Compared to the power amplifier circuit in accordance with an embodiment of the invention, the impedance compensation circuit of the conventional power amplifier circuit does not have an impedance inverter.

FIG. 8A shows imaginary loads as seen from the power transistors' current sources versus parasitic capacitances of the power transistors. The imaginary load of the conventional power amplifier circuit is represented by a solid line, while the imaginary load of the power amplifier circuit in accordance with an embodiment of the invention is represented by a dotted line. As shown in FIG. 8A, the imaginary load of the conventional power amplifier circuit demonstrates a large shift for the power amplifier parasitic capacitance between 10 pF and 15 pF. The imaginary load of the power amplifier circuit in accordance with an embodiment of the invention demonstrates only a small shift for the power amplifier parasitic capacitance between 10 pF and 15 pF. The substantially constant imaginary load of the power amplifier circuit in accordance with an embodiment of the invention is desired and cannot be achieved by the conventional power amplifier circuit.

FIG. 8B shows real loads as seen from the power transistors' current sources versus parasitic capacitances of the power transistors. The real load of the conventional power amplifier circuit is represented by a solid line, while the real load of the power amplifier circuit in accordance with an embodiment of the invention is represented by a dotted line. As shown in FIG. 8B, the real load of the conventional power amplifier circuit is substantially constant for the power amplifier parasitic capacitance between 10 pF and 15 pF. The real load of the power amplifier circuit in accordance with an embodiment of the invention demonstrates some changes for the power amplifier parasitic capacitance between 10 pF and 15 pF. However, changes in the real load of the power amplifier circuit for the power amplifier parasitic capacitance between 10 pF and 15 pF are not significant and give a small load line modulation effect.

Figure 9:
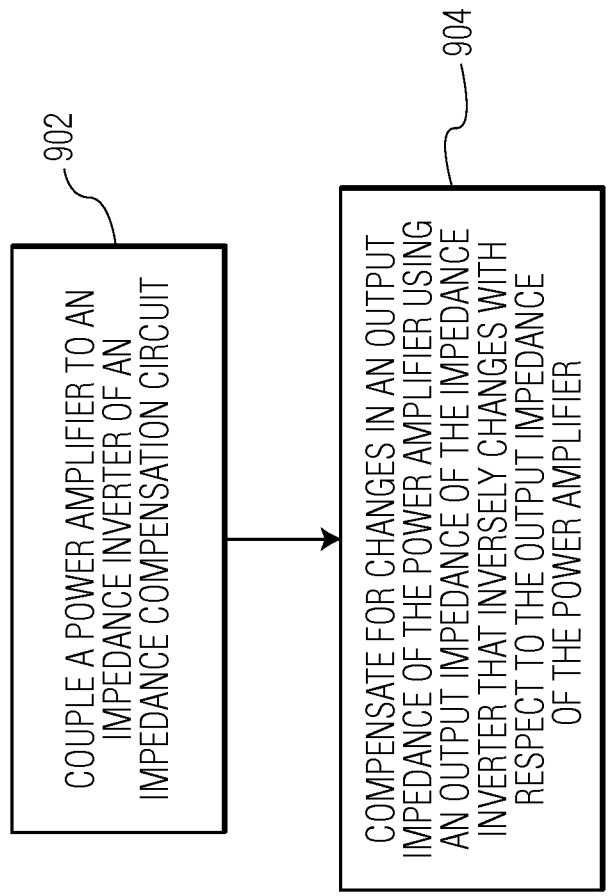
FIG. 9 is a process flow diagram of a method for compensating for changes in an output impedance of a power amplifier in accordance with an embodiment of the invention.

FIG. 9 is a process flow diagram of a method for compensating for changes in an output impedance of a power amplifier in accordance with an embodiment of the invention. At block 902, the power amplifier is coupled to an impedance inverter of an impedance compensation circuit. At block 904, the changes in the output impedance of the power amplifier is compensated using an output impedance of the impedance inverter that inversely changes with respect to the output impedance of the power amplifier.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for compensating for changes in an output impedance of a power amplifier, the method comprising:
    coupling the power amplifier to an impedance inverter of an impedance compensation circuit; and
    compensating for the changes in the output impedance of the power amplifier using an output impedance of the impedance inverter that inversely changes with respect to the output impedance of the power amplifier, wherein the impedance inverter comprises an inductor and a variable capacitor or a transistor that is connected to the inductor, wherein the inductor and the variable capacitor or the transistor are configured to operate under same supply voltage as the power amplifier, which is applied to an intersection point between the inductor and the variable capacitor or the transistor, and resonate with the output impedance of the power amplifier under the operating frequency of the power amplifier.

2. The method of claim 1, wherein the output impedance of the power amplifier is dependent on the supply voltage to the power amplifier.

3. The method of claim 2, wherein the impedance inverter comprises the inductor and the variable capacitor connected to the inductor.

4. The method of claim 2, wherein the impedance inverter comprises the inductor and the transistor connected to the inductor.

5. The method of claim 2, wherein the output impedance of the power amplifier is an input impedance to the impedance inverter, wherein the power amplifier comprises a power transistor, and wherein the output impedance of the power amplifier is an output impedance of the power transistor.

6. The method of claim 1, wherein the supply voltage to the power amplifier tracks an envelope of an input signal of the power amplifier.

7. An impedance compensation circuit comprising:
    an input terminal connected to a power amplifier;
    an impedance inverter coupled to the power amplifier through the input terminal, the impedance inverter being configured such that the output impedance of the impedance inverter is proportional to the inverse of the output impedance of the power amplifier to compensate for changes in an output impedance of the power amplifier, wherein the impedance inverter comprises an inductor and a variable capacitor or a transistor that is connected to the inductor, wherein the inductor and the variable capacitor or the transistor are configured to operate under same supply voltage as the power amplifier, which is applied to an intersection point between the inductor and the variable capacitor or the transistor, and resonate with the output impedance of the power amplifier under the operating frequency of the power amplifier; and
    an output terminal connected to a load of the power amplifier.

8. The impedance compensation circuit of claim 7, wherein the power amplifier is configured such that the output impedance of the power amplifier is dependent on the supply voltage to the power amplifier.

9. The impedance compensation circuit of claim 8, wherein the impedance inverter comprises the inductor and the variable capacitor connected to the inductor.

10. The impedance compensation circuit of claim 8, wherein the impedance inverter comprises the inductor and the transistor connected to the inductor.

11. The impedance compensation circuit of claim 8, wherein the output impedance of the power amplifier is an input impedance to the impedance inverter.

12. The impedance compensation circuit of claim 8, wherein the power amplifier comprises a power transistor, wherein the output impedance of the power amplifier is an output impedance of the power transistor, and wherein the output impedance of the power transistor comprises parasitic capacitance of the power transistor.

13. The impedance compensation circuit of claim 7, wherein the supply voltage to the power amplifier tracks an envelope of an input signal of the power amplifier.

14. A power amplifier circuit comprising:
a power amplifier having an output impedance; and
an impedance compensation circuit connected to the power amplifier, the impedance compensation circuit comprising:
an input terminal connected to the power amplifier;
an impedance inverter coupled to the power amplifier through the input terminal, the impedance inverter being configured such that the output impedance of the impedance inverter is proportional to the inverse of the output impedance of the power amplifier to compensate for changes in an output impedance of the power amplifier, wherein the impedance inverter comprises an inductor and a variable capacitor or a transistor that is connected to the inductor, wherein the inductor and the variable capacitor or the transistor are configured to operate under same supply voltage as the power amplifier, which is applied to an intersection point between the inductor and the variable capacitor or the transistor, and resonate with the output impedance of the power amplifier under the operating frequency of the power amplifier; and
an output terminal connected to a load of the power amplifier.

15. The power amplifier circuit of claim 14, wherein the power amplifier comprises a power transistor, wherein the output impedance of the power amplifier is an output impedance of the power transistor, wherein the power transistor is configured such that the output impedance of the power transistor is dependent on the supply voltage to the power amplifier, wherein the output impedance of the power transistor is an input impedance to the impedance inverter, and wherein the impedance inverter and the power amplifier are configured to operate under the same supply voltage.

16. The power amplifier circuit of claim 15, wherein the impedance inverter comprises the inductor and the variable capacitor connected to the inductor.

17. The power amplifier circuit of claim 15, wherein the impedance inverter comprises the inductor and the transistor connected to the inductor.

18. The power amplifier circuit of claim 14, wherein the power amplifier and the impedance inverter are components of a wireless device.

19. The power amplifier circuit of claim 14, wherein the power amplifier and the impedance inverter are packaged in a single integrated circuit package.

20. The power amplifier circuit of claim 14, further comprising an envelope tracking circuit configured to generate the supply voltage to the power amplifier that tracks an envelope of an input signal of the power amplifier.

* * * * *